United States Patent [19]

Leone

[11] Patent Number: 5,440,593

[45] Date of Patent: Aug. 8, 1995

[54] COMBINED ALIGNER BLENDER

[75] Inventor: Pasquale Leone, Toronto, Canada

[73] Assignee: ATI Technologies Inc., Thornhill, Canada

[21] Appl. No.: 129,342

[22] Filed: Sep. 30, 1993

[51] Int. Cl.⁶ .............................................. H04L 7/00
[52] U.S. Cl. ............................ 375/354; 348/501; 348/510; 348/538; 348/806; 375/243; 364/724.1; 364/724.17
[58] Field of Search .................. 375/106, 11, 14, 26, 375/118; 364/724.1, 724.17; 341/131, 50, 61; 348/501, 510, 806, 807, 538; 328/151; 307/352, 353

[56] References Cited

U.S. PATENT DOCUMENTS

| | | | |
|---|---|---|---|
| 4,604,720 | 8/1986 | Stikvoort | 364/724.1 |
| 4,667,240 | 5/1987 | Willis et al. | 358/167 |
| 4,694,414 | 9/1987 | Christopher | 364/724.1 |
| 4,771,334 | 9/1988 | Bolger | 348/807 |
| 5,280,345 | 1/1994 | Uehara et al. | 348/500 |
| 5,285,401 | 2/1994 | Pelloni | 364/724.1 |

*Primary Examiner*—Stephen Chin
*Assistant Examiner*—Amanda Le
*Attorney, Agent, or Firm*—Pascal & Associates

[57] ABSTRACT

The present invention relates to a method of aligning and blending input digital samples, comprised of delaying the input samples by a clock pulse, to provide delayed data samples, subtracting a smaller fractional part from a larger fractional part of either an input sample number and a requested sample number to provide a sample difference number first factor, subtracting the sample difference number from 1 to provide a second factor, multiplying either of the input samples or the delayed samples by the first factor to provide a first result, multiplying the other of the input samples or the delayed samples by the second factor to provide a second result, and adding the results to provide output samples.

8 Claims, 2 Drawing Sheets

5,440,593

COMBINED ALIGNER BLENDER

FIELD OF THE INVENTION

This invention relates to the field of digital video, and particularly to a combined aligner blender for processing pixel data.

BACKGROUND TO THE INVENTION

Digital samples of e.g. video data to be displayed on a computer monitor is processed by a video graphics circuit, which has the task of both aligning samples provided by an asynchronous sampler, and blending those samples. Blending can involve changing the sampling rate of those samples, for example when the scale is to be varied. Thus the effect can be reduced resolution, and thus can be likened to the data passing through a low pass filter.

FIG. 1 is a block diagram that illustrates how sampling can be done. For example, the input samples of e.g. a video stream which have been sampled using an asynchronous clock are to be resampled so that they are synchronous with a reference clock. The reference clock is usually at a different phase than the sampling clock, and in a video signal, the reference is usually the horizontal sync edge. Thus, after sampling, the horizontal sync edge is used to assign fractional sample numbers to the asynchronously sampled samples. The circuit is then used to resample the samples in order to produce samples that can be numbered with integer sample numbers.

The input samples are applied to a one bit clock delay circuit 3. The input samples are multiplied in multiplier 5 with a data signal $(1-x)$, where x represents the fractional part of the incoming sample number. The delayed input samples are multiplied in multiplier 7 with data signal x. The result data of the multiplication is added in adder 9, providing an output sample signal.

Let us assume that we have sampled a ramp in voltage such that the sample value is equal to the sample number. Assume that the input sample numbers and values are 100.1, 101.1, 102.1, 103.1, 104.1, and assume that the desired output sample numbers and values are 101.0, 102.0, 103.0, etc. The circuit described above interpolates between two samples (e.g. samples 101.1 and 102.1) to find the value for the sample 102.0.

The fractional part of the incoming sample number, $x=0.1$. The output of multiplier 7 is $(100.1\times 0.1)=10.01$ and the output of multiplier 5 is $(101.1\times 0.9)=90.99$. The output of adder 9 is $10.01+90.99=101$. Similarly, for the next sample, the output of multiplier 7 is $(101.1\times 0.1)=10.11$ and the output of multiplier 9 is $(102.1\times 0.9)=91.8$; the output of adder 9 is $10.11+91.89=102$. In this way the desired samples have been derived from the existing samples, the desired samples being aligned to the horizontal sync edge.

A horizontal scaler performs blending among two or more samples to better represent scaling, as distinguished from simply dropping samples. A blender produces fractional samples from samples that are integer numbered.

Scaling will be better understood from a consideration of FIG. 2, which is similar to FIG. 1 except for the factor which is multiplied by the input sample number and delayed sample number. The factor y which is multiplied in multiplier 5 with the input sample number is the fractional part of a requested sample number, and the factor which is multiplied with the delayed sample number is $(1-y)$.

Thus for example, if the input sample numbers are 100.0, 101.0, 102.0, 103.0, etc., and the video graphics circuit is to scale down 1.5:1, then the output sample numbers would be numbered 100.0, 101.5, 103.0, 104.5, etc. The calculations to determine these are done as in the example given with reference to FIG. 1, since the circuits operate similarly.

It will be recognized that the scaler also degrades the resolution of the signal, and thus operates as a finite impulse response (FIR) low pass filter. Therefore in order to perform both sample aligning and scaling blending of a digital video signal, there are in effect two FIR low pass filters in series filtering the signal, which further degrade the signal, to an objectionable extent.

SUMMARY OF THE INVENTION

The present invention is a method of sample aligning and scaling blending in which the sample data passes through only one filter, and thus suffers only one low pass effect. In addition, only two multipliers, one delay, and one adder are required, instead of double the number as would be required by using the prior art means described above. The total amount of circuitry is thus reduced, and the quality of the resulting signal is improved.

In accordance with an embodiment of the invention, a method of aligning and blending input digital samples is comprised of delaying the input samples by a clock pulse, to provide delayed data samples, subtracting a smaller fractional part from a larger fractional part of either an input sample number and a requested sample number to provide a sample difference number first factor, subtracting the sample difference number first factor from 1 to provide a second factor, multiplying either of the input samples or the delayed samples by the first factor to provide a first result, multiplying the other of the input samples or the delayed samples by the second factor to provide a second result, and adding the results to provide output samples.

BRIEF INTRODUCTION TO THE DRAWINGS

A better understanding of the invention will be obtained by reference to the detailed description below, in conjunction with the following drawings, in which:

FIG. 1 is a block diagram used to describe sample alignment in accordance with the prior art, FIG. 2 is a block diagram used to describe scaling blending in accordance with the prior art, FIG. 3 is a block diagram used to describe a combined aligner and scaling blender, in accordance with one embodiment of the invention, and FIG. 4 is a block diagram used to describe a combined aligner and scaling blender, in accordance with another embodiment of the invention.

DETAILED DESCRIPTION OF THE INVENTION

Figure 1:
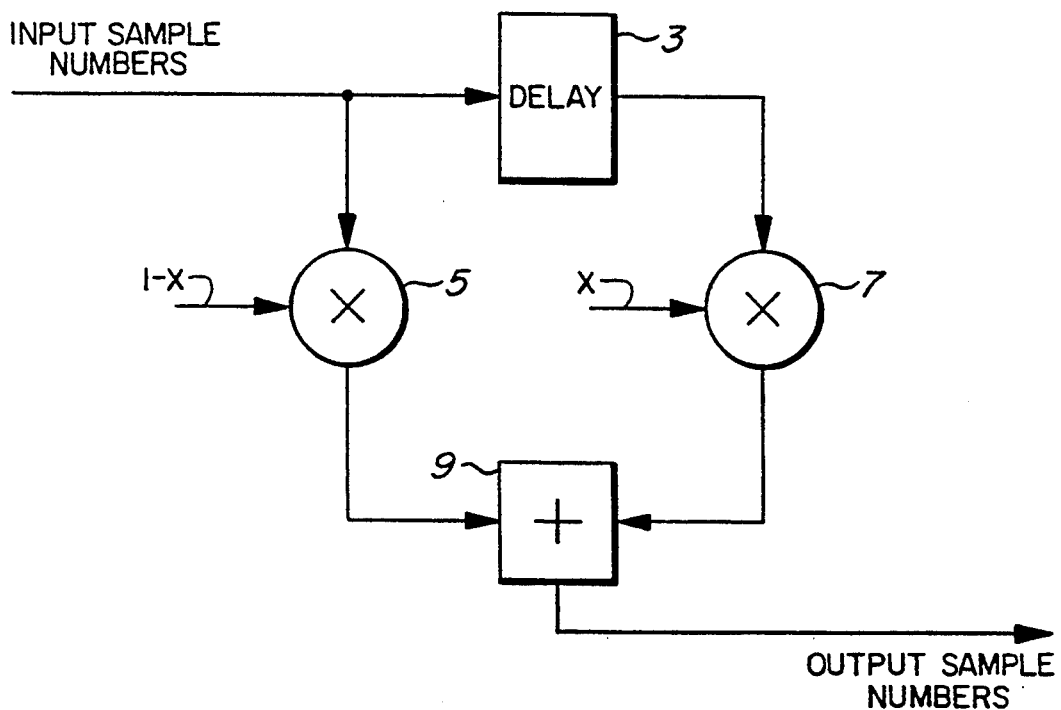
Figure 2:
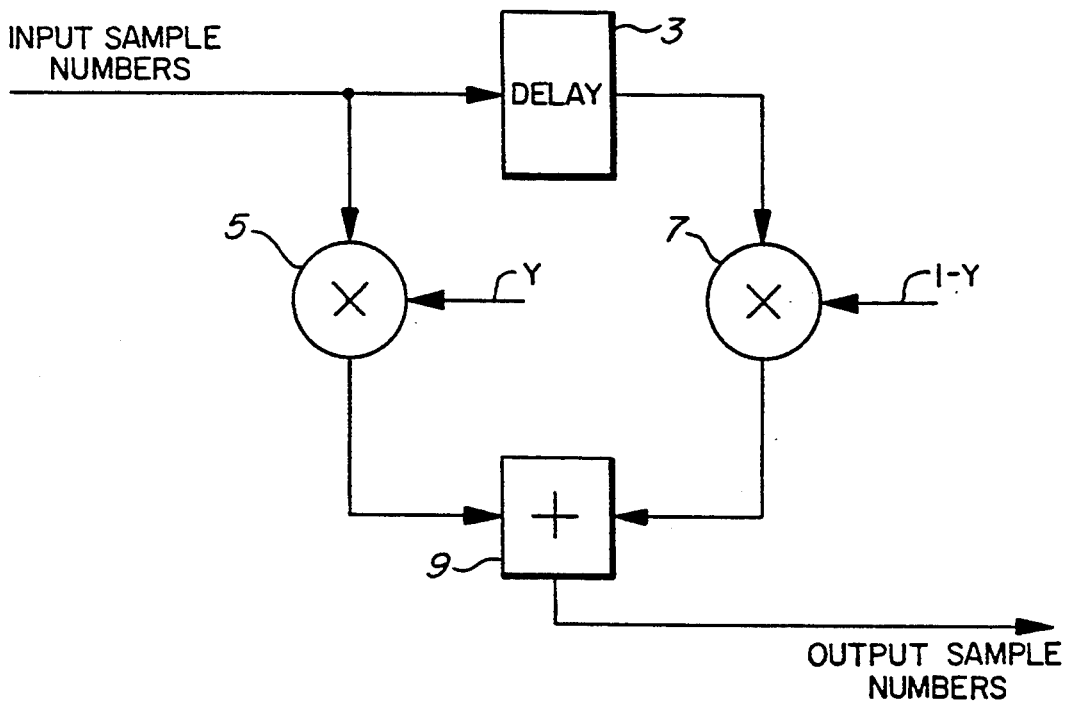
Figure 3:
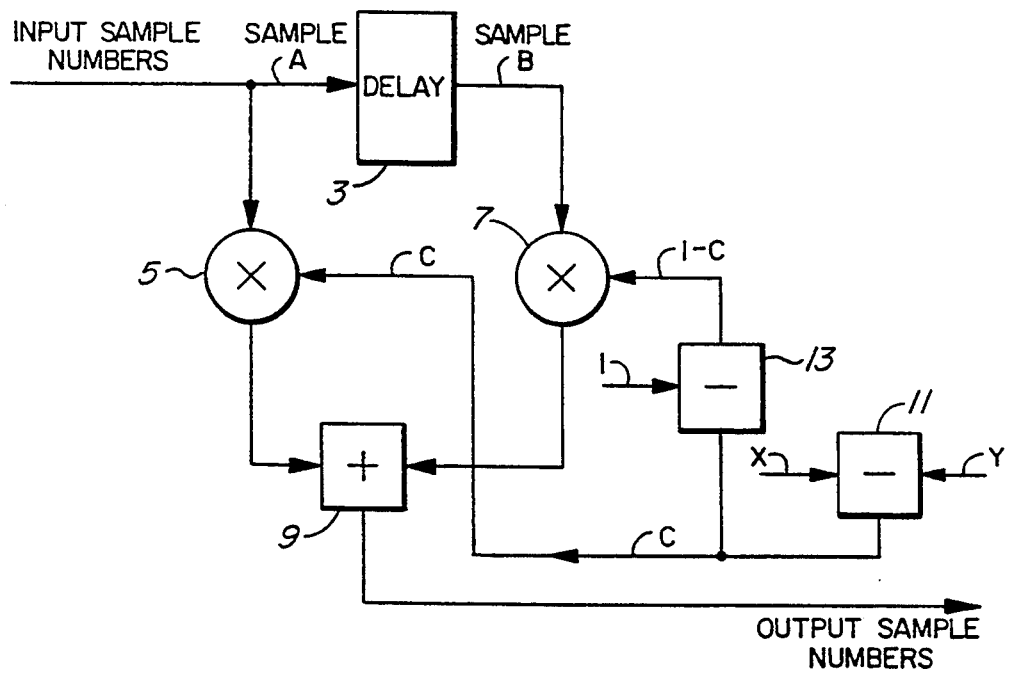

With reference to FIG. 3, input samples are delayed in one clock pulse delay, and the input samples a and delayed samples b are used as inputs to multipliers 5 and 7 respectively. Input c is applied as a multiplying factor to multiplier 5 and input $(1-c)$ is applied as a multiplying factor to multiplier 7. The outputs of multipliers 5 and 7 are applied to adder 9, where they are added together. The output of adder 9 provides a data signal representing output samples.

The multiplying factors are provided as follows. The fractional part x of the incoming sample number and the fractional part y of a requested sample number are subtracted in subtractor 11, in the manner to be described below. The result is applied as a multiplying factor c to one of the multipliers 5 or 7, as will be described below. For the example shown, the output of subtractor 11 is applied to multiplier 5.

The output of subtractor is also subtracted from one (1) in subtractor 13, resulting in factor (1−c). That factor is applied to the other of multipliers 5 and 7.

If a sample a sample number is for example 100.x and the sample b sample number is 101.x, and the scaler requests sample 100.y which is between 100.x and 101.x, it is clear that y>x. The process for the entire circuit is thus, in algorithmic terms the output sample number=(1−(y−x))*a+(y−x)*b.

If the sample a sample number is 100.x and the sample b sample number is 101x., and the scaler requests sample 101.y which is between 100.x and 101.x, it is clear that y<x. The process for the entire circuit is thus, in algorithmic terms

*the output sample number=(x−y)*a+(1−(x−y))*b.*

Thus for the case in which the fractional part of the input sample number is greater than the fractional part of the requested sample number, x>y, and the fractional part of the requested sample number y is subtracted from the fractional part of the input sample number x (x−y) in subtractor 11, and the resulting factor is c and is applied to the multiplier 5 to be multiplied with the sample numbers of the input samples, as is shown in FIG. 3.

The factor c is subtracted from 1 by multiplier 13 and the resulting factor (1−c) is applied to multiplier 7 to be multiplied with the delayed input sample numbers b.

On the other hand, if the fractional part of the input sample number x is smaller than the fractional part of the requested sample number y, i.e. x<y, then the fractional part of the input sample number is subtracted from the fractional part of the requested sample number by subtractor 11, and the result is subtracted from 1 by subtractor 13. Now that factor is applied to multiplier 5, while the factor (y−x) is applied to multiplier 7. In other words, in this case the inputs of multipliers 5 and 7 are interchanged.

It should be noted that since the values of y and x are less than 1, the subtractions can be done modulo 1 (i.e. if the result is negative, add 1), and the two algorithms would be equivalent. This is because when the subtraction is modulo 1, the first algorithm remains the same when y>x, and changes to the second algorithm when y<x.

The above embodiments are satisfactory when the spacing between the fractional components are 1. However, the following embodiments should be used if the incoming sample numbers have a fractional component and the spacing between them is not 1. This case will occur when asynchronous samples are to be aligned to a reference that is not only at a different phase but at a different frequency from the sampling clock.

Figure 4:
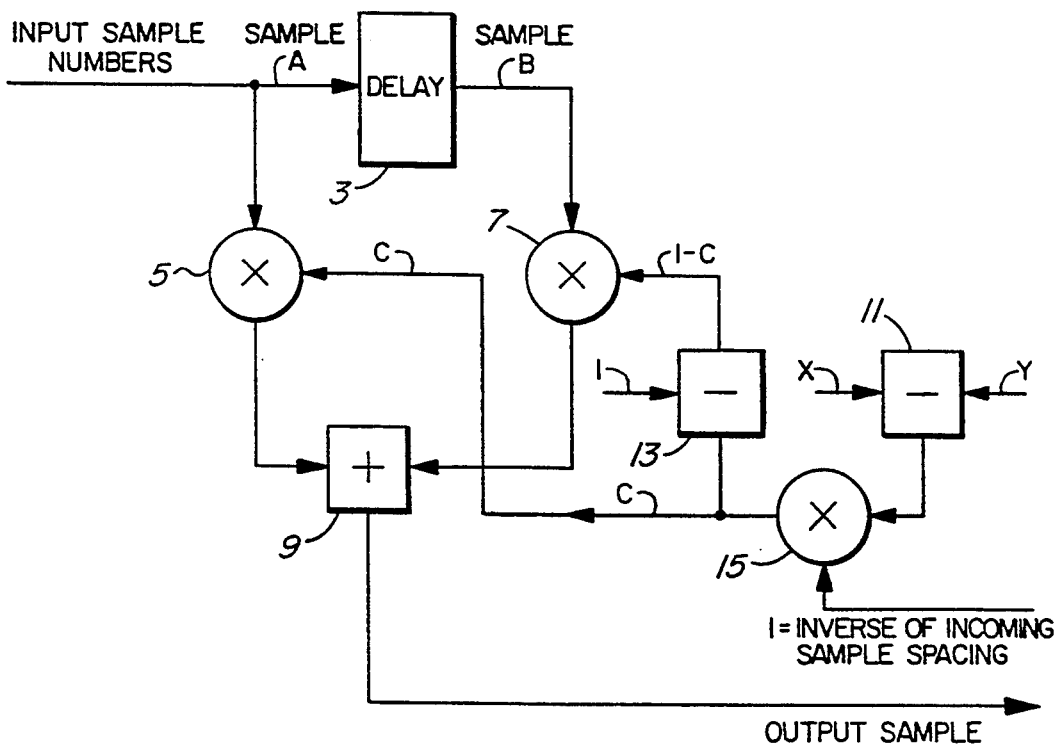

With reference to FIG. 4, the process block diagram is similar to that of FIG. 3 except for the inclusion of a multiplier or divider function block 15 in series with the output of the subtractor 11. An input to the block 15 is either the value of the spacing between adjacent incoming samples i, if the block 15 is a divider, or the inverse of the value of the spacing between adjacent incoming samples I, if the block 15 is a multiplier.

Thus an algorithm describing operation of the entire circuit, to align asynchronous samples to a reference that is not only at a different phase but also at a different frequency from the sample block is:

*output sample numbers=(1−(y−x)/i)*a+((y−x)/i*b.*

An algorithm describing operation of the entire circuit, wherein the block 15 is a multiplier is:

*output sample numbers=(1−(y−x)*I)*a+((y−x)*I)*b*

For example, if the input sample numbers are 100.0, 100.8, 101.6, 102.4, 103.2, etc. (i=0.8), and the scalar requested sample number is 100.3, then the method described in the second algorithm would provide (1−(.3−8)−1.25)a+((.3−.8)*1.25)*b=.37-5*a+.625*b.

The spacing values are considered to be a programmable parameter, and thus both the spacing values and the inverse of the spacing values can be programmed.

The invention described herein can be used to resample the original asynchronous samples to a new phase and frequency and independently blend adjacent samples for scaling purposes, with reduced circuitry and improved resolution. It will be recognized that the process blocks described herein can be realized in hardware, firmware or software.

A person having read this specification may now design variations using the principles described herein. All are considered to be within the scope of this invention as defined in the claims appended hereto.

I claim:

1. A method of aligning and blending input digital video signal samples, comprising:
   (a) delaying said input video signal samples by a clock pulse, to provide a signal comprising delayed data samples,
   (b) subtracting a smaller fractional part from a larger fractional part of one of an input sample number and a requested sample number to provide a signal representing a sample different number first factor,
   (c) subtracting the signal representing the sample different number from a signal representing 1 to provide a signal representing a second factor,
   (d) multiplying one of the video signal input samples and the signal comprising delayed samples by the signal representing the second factor to provide a second result signal, and
   (f) adding said first and second result signals to provide an output signal of aligned and blended input video signal samples.

2. A method as defined in claim 1 in which the spacing between the input and requested sample numbers is 1.

3. A method as defined in claim 2 in which the fractional part of the input sample number is greater than the fractional part of the requested sample number, and in which the input samples represented by sample numbers are multiplied by the signal representing the first factor, and the delayed samples represented by sample numbers are multiplied by the signal representing the second factor.

4. A method as defined in claim 2 in which the fractional part of the input sample number is smaller than the fractional part of the requested sample number, and in which the input samples represented by sample numbers are multiplied by the signal representing the second factor, and the delayed samples represented by sample numbers are multiplied by the signal representing the first factor.

5. A method as defined in claim 1, further including the steps of modifying said first factor by dividing said first factor by a signal representing a sample spacing factor prior to said multiplying steps, wherein the spacing factor is a signal representing a numerical value representing spacing between adjacent input samples.

6. A method as defined in claim 5 wherein the spacing between adjacent input samples is a value other than 1.

7. A method as defined in claim 1 further including the steps of modifying said first factor by multiplying said first factor by a signal representing a sample spacing factor prior to said multiplying steps, wherein the spacing factor is a signal representing an inverse of spacing between adjacent input samples.

8. A method as defined in claim 7 wherein the spacing between adjacent input samples is a value other than 1.

* * * * *